(12) United States Patent
Nagarajan et al.

(10) Patent No.: US 12,165,956 B2
(45) Date of Patent: Dec. 10, 2024

(54) MOLDED SILICON ON PASSIVE PACKAGE

(71) Applicant: Apple Inc., Cupertino, CA (US)

(72) Inventors: Kumar Nagarajan, Cupertino, CA (US); Flynn P. Carson, Redwood City, CA (US); Karthik Shanmugam, Singapore (SG); Menglu Li, San Jose, CA (US); Raymundo M. Camenforte, San Jose, CA (US); Scott D. Morrison, Austin, TX (US)

(73) Assignee: Apple Inc., Cupertino, CA (US)

(*) Notice: Subject to any disclaimer, the term of this patent is extended or adjusted under 35 U.S.C. 154(b) by 38 days.

(21) Appl. No.: 17/643,247

(22) Filed: Dec. 8, 2021

(65) Prior Publication Data
US 2023/0178458 A1    Jun. 8, 2023

(51) Int. Cl.
| | |
|---|---|
| H01L 23/495 | (2006.01) |
| H01L 23/31 | (2006.01) |
| H01L 23/532 | (2006.01) |
| H01L 23/538 | (2006.01) |
| H01L 25/16 | (2023.01) |
| H01L 49/02 | (2006.01) |

(52) U.S. Cl.
CPC .......... *H01L 23/4952* (2013.01); *H01L 23/31* (2013.01); *H01L 23/53228* (2013.01); *H01L 23/5381* (2013.01); *H01L 28/00* (2013.01)

(58) Field of Classification Search
CPC .......... H01L 23/49517; H01L 23/4952; H01L 23/49582; H01L 23/50; H01L 23/53228; H01L 23/5381; H01L 23/552; H01L 24/05; H01L 24/96; H01L 28/00
See application file for complete search history.

(56) References Cited

U.S. PATENT DOCUMENTS

| | | |
|---|---|---|
| 6,841,842 B2 * | 1/2005 | Li .......................... H01L 31/12 257/431 |
| 7,005,747 B2 | 2/2006 | Koizumi |
| 7,091,586 B2 | 8/2006 | Millik et al. |
| 7,317,622 B2 | 1/2008 | Li |
| 7,615,407 B1 | 11/2009 | Poddar et al. |
| 7,875,973 B2 | 1/2011 | Chiu |
| 8,188,594 B2 | 5/2012 | Ganesan et al. |
| 8,597,979 B1 | 12/2013 | Burgyan |
| 9,312,218 B2 | 4/2016 | Choi et al. |
| 9,553,061 B1 | 1/2017 | Letourneau et al. |
| 9,633,977 B1 | 4/2017 | We et al. |
| 10,068,862 B2 | 9/2018 | Do et al. |
| 10,418,317 B2 | 9/2019 | Lee et al. |
| 10,629,507 B1 | 4/2020 | Li et al. |
| 11,395,408 B2 | 7/2022 | Morrison et al. |
| 2009/0085185 A1 * | 4/2009 | Byun ..................... H01L 25/50 257/E23.169 |
| 2009/0267220 A1 * | 10/2009 | Kuhlman ............... H01L 25/16 438/118 |

(Continued)

*Primary Examiner* — Omar F Mojaddedi
(74) *Attorney, Agent, or Firm* — Aikin & Gallant, LLP

(57) ABSTRACT

Package structures, modules containing such packages and methods of manufacture. are described. In an embodiment, a package includes a plurality of terminal pads, a plurality of passive components bonded to top sides of the plurality of terminal pads, a die bonded to top sides of the plurality of passive components and a molding compound encapsulating at least the plurality of passive components and the die.

15 Claims, 10 Drawing Sheets

(56) References Cited

U.S. PATENT DOCUMENTS

| | | | |
|---|---|---|---|
| 2011/0068459 A1 | 3/2011 | Pagaila et al. | |
| 2013/0069239 A1* | 3/2013 | Kim | H01L 23/49827 |
| | | | 257/774 |
| 2014/0252544 A1 | 9/2014 | Li et al. | |
| 2014/0367865 A1 | 12/2014 | Powell et al. | |
| 2015/0294791 A1 | 10/2015 | Hwang et al. | |
| 2016/0084887 A1 | 3/2016 | Beer et al. | |
| 2016/0176701 A1 | 6/2016 | Gupta et al. | |
| 2017/0064837 A1 | 3/2017 | Li et al. | |
| 2018/0145033 A1 | 5/2018 | Yi et al. | |
| 2019/0013301 A1 | 1/2019 | Cheah et al. | |
| 2019/0198445 A1 | 6/2019 | Alur et al. | |
| 2020/0020653 A1 | 1/2020 | Lim et al. | |
| 2020/0075521 A1 | 3/2020 | Elsherbini et al. | |
| 2020/0357737 A1 | 11/2020 | Arvin et al. | |
| 2020/0373289 A1* | 11/2020 | Yang | H01L 24/17 |
| 2022/0071013 A1 | 3/2022 | Morrison et al. | |

* cited by examiner

MOLDED SILICON ON PASSIVE PACKAGE

BACKGROUND

Field

Embodiments described herein relate to microelectronic packaging, and more particularly to system in packages with stacked active devices and passive components.

Background Information

Today, the electronics industry uses a lot of passive and active components as part of integrated circuits for different systems or sub-systems in many products such as touch sensing, haptics module or camera module. Due to the increasing need for miniaturizing systems, they are typically packaged as system in packages (SiPs) where the dies and components are assembled/soldered side-by-side on a printed circuit board (PCB) and then encapsulated using a molding compound. This helps in placing the dies and various components required for a system together in one place.

SUMMARY

Molded package structures, methods of manufacture, and modules including such packages are described. In an embodiment, package includes a plurality of terminal pads, a plurality of passive components bonded to top sides of the plurality of terminal pads, a die bonded to top sides of the plurality of passive components, and a molding compound layer encapsulating the plurality of passive components and the die. In accordance with embodiments a planarized surface spans bottom sides of the plurality of terminal pads. In some embodiments, the planarized surface additional spans a bottom side of the molding compound layer, and a portion of the molding compound layer spans underneath the plurality of passive components and laterally between the plurality of terminal pads. In some embodiments, the plurality of terminal pads can be pre-packaged or molded in a package substrate. Such a configuration may additionally support a bridge between at least two terminal pads.

DETAILED DESCRIPTION

Figure 1:
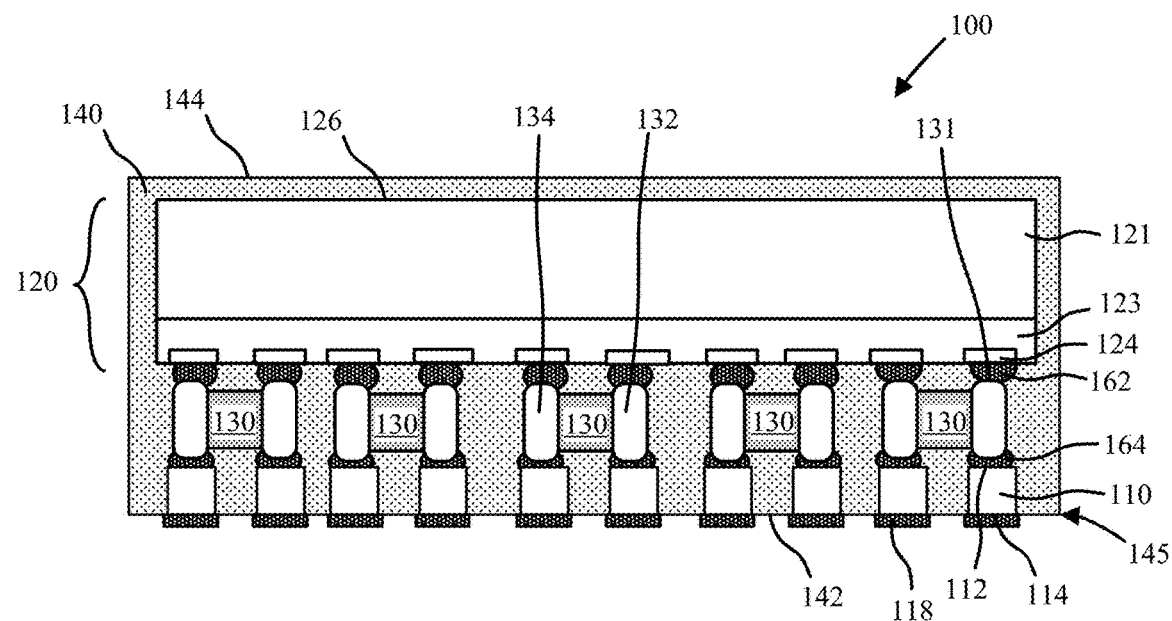
FIG. 1 is a schematic cross-sectional side view illustration of a package including a die bonded to top sides of a plurality of passive components in accordance with an embodiment.

Embodiments describe package structures, modules containing such packages and methods of manufacture. In particular, the methods of manufacture include a sequence in which a plurality of passive components can be first mounted onto a patterned lead frame and tested, followed by mounting of known good dies. The stacked passives and dies can then be molded and singulated into packages. Thus, the known good dies can be integrated onto a known good arrangement of passive devices and prior to molding. Furthermore, molding can be performed prior to mounting onto a module PCB rather than afterward. In another aspect, the plurality of terminal pads in accordance with embodiments is manufactured from a lead frame.

In a particular manufacturing sequence, a plurality of cavities is formed into a top surface of a lead frame leaving behind what will become top sides of the plurality of terminal pads. The plurality of passive components is then mounted onto the patterned lead frame, followed by mounted of the dies onto the passive components and molding of the patterned lead frame, passive components and dies in a molding compound layer. A bulk of the lead frame can then be removed, for example with a backgrinding sequence leaving behind a planarized bottom surface including a plurality of exposed metal terminal pads and the molding compound layer. Thus, the lead frame is partially consumed in such a manufacturing sequence, which can contribute to a reduced overall package thickness. In such an embodiment, the planarized surface can additionally span a bottom side of the molding compound layer, and a portion of the molding layer may additionally span underneath the plurality of passive components and laterally between the plurality of terminal pads, thus additionally encapsulating the terminal pads.

The manufacturing sequences in accordance with embodiments may be utilized to fabricate SiPs with reduced area and thickness by stacking dies on top of passives and replacing a conventional package substrate with thin terminal pads. In particular, the subtractive processing sequence with the patterned lead frame can achieve terminal pad thickness of less than 75 µm, and overall thin SiP form factor of less than 650 µm, for example.

Where additional package routing is to be included, a pre-formed package substrate can be used in place of a lead frame to allow additional routing such as lateral redistribution lines or bridges between terminal pads. Other means of routing technology such as molded interconnect substrate or routable lead frame technology may be used to achieve the same result. In such an embodiment, the plurality of passive components is mounted onto the plurality of terminal pads of the pre-formed package substrate, followed by mounting the dies and the molding of the passive components and dies on top of the pre-formed package substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

FIG. 1 is a schematic cross-sectional side view illustration of a package 100 including a die 120 bonded to top sides 131 of a plurality of passive components 130 in accordance with an embodiment. The plurality of passive components 130 may be directly underneath the die 120, within a shadow of the die 120. As shown, the package 100 includes a plurality of terminal pads 110, each including a top side 112 and bottom side 114. A plurality of passive components 130 is bonded to the top sides 112 of the terminal pads 110, such as with solder material 164, and a die 120 is bonded to top sides 131 of the plurality of passive components 130. A molding compound layer 140 encapsulates, and laterally surrounds, the plurality of terminal pads 110, the plurality of passive components 130 and the die 120. As shown, a planarized surface 145 spans a bottom side 142 of the molding compound layer 140 and the bottom sides 114 of the plurality of terminal pads 110. Furthermore, a portion of the molding compound layer 140 may span underneath the plurality of passive components 130 and laterally between the plurality of terminal pads 110.

Still referring to FIG. 1, the plurality of passive components 130 can be bonded to the top sides 112 of the plurality of terminal pads 110 with a first solder material 164 and the die 120 bonded to the top sides 131 of the plurality of passive components 130 with a second solder material 162. The first solder material 164 may be characterized by a higher reflow temperature than the second solder material 162, particularly where the passive components 130 are first bonded to the plurality of terminal pads 110, or lead frame from which the terminal pads will be formed, followed by bonding of the die 120 to the plurality of second components 130. This may facilitate maintaining alignment (e.g. prevent tilting) of the passive components 130 when mounting the die 120 onto the passive components 130.

The dies 120 in accordance with embodiments can include a verity of different system or subsystems, such as system-on-chip (SOC) or engines such as a graphics processing unit (GPU), a central processing unit (CPU), a neural engine (e.g. neural network processing engine), an artificial intelligence (AI) engine, a signal processor, networks, caches, and combinations thereof. However, embodiments are not limited to engines, and may include memory devices, such as SRAM, MRAM, DRAM, NVRAM, NAND, cache memory, power management integrated circuit (IC), amongst others. In an embodiment, the die 120 includes a traditional bulk layer 121 (e.g. crystalline silicon) into which devices such as transistors, etc. are formed and a back-end-of-the-line (BEOL) build-up structure 123 which typically includes metallization layers and dielectric layers. For example, build-up structure 123 may be formed using a damascene or dual damascene process to form interconnect layers and vias (e.g. copper, aluminum). For example, such damascene or dual damascene processes may include planarized metallization layers and vias. Dielectric layers, also referred to as interlayer dielectrics, can also be planarized. Suitable materials include oxides (e.g. $SiO_2$), nitrides, low-K dielectrics such as fluorine doped silicon oxide, carbon doped silicon oxide, porous oxides, and spin on dielectrics. The build-up structure 123 may terminate with contact pads 124. For example, both of which may be copper pads, aluminum pads, multi-layer under bump metallurgy (UBM) pads, etc.

The passive components 130 in accordance with embodiments can be a variety of passive components such as capacitor, inductor, resistor, etc. or dummy components. This is described in further detail with regard to FIGS. 3A-3H. In the exemplary embodiment illustrated, the passive components 130 include two terminals 132, 134, each terminal optionally electrically connected between the die 120 and terminal pads 110. It is to be appreciated that this is exemplary, and embodiments are not limited to passive components with two terminals.

The terminal pads 110 in accordance with embodiments, can include planarized top sides 112 and planarized bottom sides 114. The terminal pads 110 may be formed of a variety of electrically conductive materials, including metals such as copper. The terminal pads 110 may be studs, such as copper studs. In some embodiments thickness of the terminal pads 110 can be determined with a subtractive process such as backgrinding. In an embodiment, the terminal pads 110 have a thickness of less than 75 μm tall. In this manner, overall package 100 thickness is reduced, where the inclusion of the terminal pads 110 can replace a traditional package substrate. In an embodiment, total thickness between the planarized surface 145 and a top surface 144 of the molding compound layer 140 is less than 650 μm, or less than 600 μm. By way of illustrative example, total thickness of the terminal pads 110 is approximately 50 μm, thickness of the passive components 130 and solder material 164 is 150-250 μm, thickness of the die 120 is 150-200 μm, thickness of solder material 162 is 35 μm, and thickness of the molding compound layer 140 spanning over a top side 126 of the die 120 is 0-60 μm. Solder pads 118 can additionally be applied to the bottom sides 114 of the terminal pads 110, for example, to assist with joint formation when mounting onto a module substrate. Solder pads 118 may have a thickness of approximately 20 μm for example.

Figure 2:
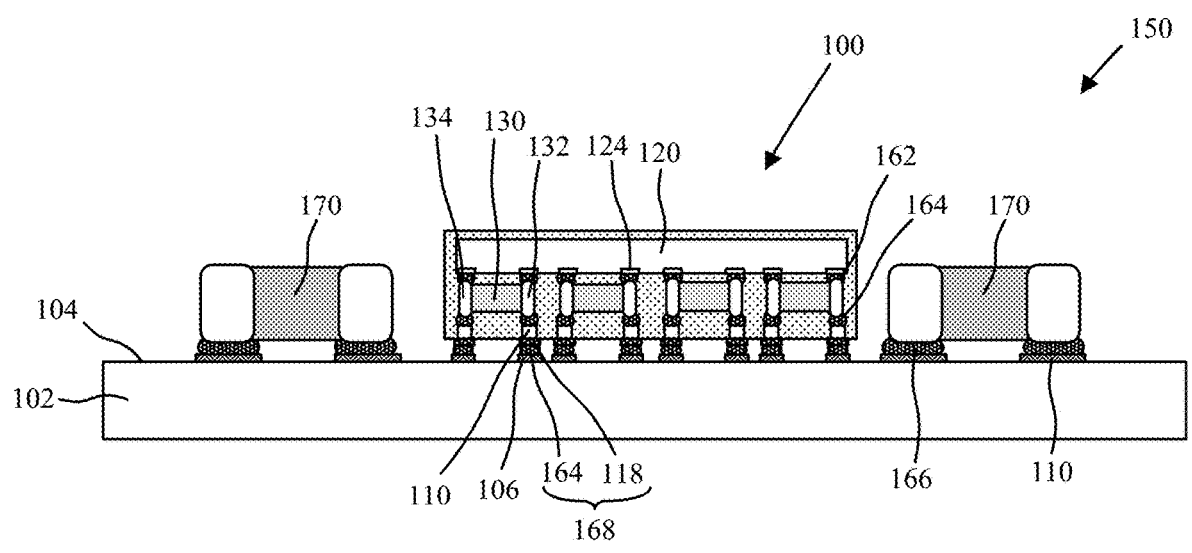
FIG. 2 is a schematic cross-sectional side view illustration of a module with package including a die bonded to top sides of a plurality of passive components in accordance with an embodiment.

Referring now to FIG. 2, the package 100 can be surface mounted onto a module substrate along with other components in a module 150. As shown, the module 150 includes a circuit board 102 including a top side 104 including a plurality of landing pads 106. A package 100 is mounted on the circuit board 102 and bonded the plurality of landing pads 106. For example, bonding may be accomplished with solder material 164 which can reflow with solder pads 118 to form joints 168. One or more additional components 170 or dies may also be bonded to a second plurality of landing pads 110 on the top side 104 of the circuit board 102, for example with solder joints 166. The additional components 170 may be taller than the passive components 130. As shown, locating the passive components 130 underneath the die 120 can save module area, while increasing vertical packing density, particularly when the additional component(s) 170 are taller than the die 120. In some embodiments the passive components 130 all have the same height, and optionally same size.

The passive components 130 in accordance with embodiments can have a variety of configurations that can provide electrical connection between the die 120 and circuit board 102. Furthermore, routing to contact pads 124 and landing pads 106 can partially determine functionality of the passive components 130. For example, dummy contact pads, or dummy landing pads and corresponding routing can be included to determine connectivity and function of the passive components 130. Furthermore, dummy passive components can be included, where no electrical connection is made between terminals 132, 134.

Referring now to FIGS. 3A-3H a variety of schematic cross-sectional side view illustrations are provided for electrical connection and circuit paths for a variety of passive component configurations in accordance with embodiments. The various circuit paths can include shunt paths, series paths, die only paths, circuit board only paths, series paths, multi-circuit paths, etc. It is to be appreciated the particular examples provided in FIGS. 3A-3H are illustrative, and embodiments are not so limited. Furthermore, modules 150 in accordance with embodiments may include a combination of various electrical connections, such as those illustrated and described with regard to FIGS. 3A-3H. In some embodiments, a passive component may be oriented laterally with respect to the die and circuit board to facilitate coupling of multiple terminals (e.g. a first and second terminal) on both a top side and bottom side of the passive component. Alternatively, a passive component may be oriented vertically to facilitate coupling of respective terminals to either a top side or bottom side of the passive component.

Figure 3A:
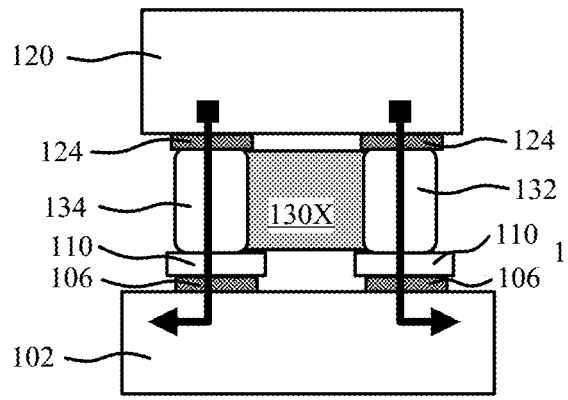
FIG. 3A is a schematic cross-sectional side view illustration of a shunt path through a passive component in accordance with an embodiment.

FIG. 3A is a schematic cross-sectional side view illustration of a shunt path through a passive component in accordance with an embodiment. As shown, a shunt path (or low resistance connection) can flow directly between the contact pads 124 and landing pads 106 through one or more terminals 132, 134 of a passive component. In particular, the passive component may be a dummy passive component 130X without an electrical connection between terminals 132, 134 or a high resistance connection therebetween, however this is not required for a shut path. In accordance with embodiments, one or both of the terminals 132, 134 can be electrically connected as a shunt path within a circuit connecting the die 120 and circuit board 102.

Figure 3B:
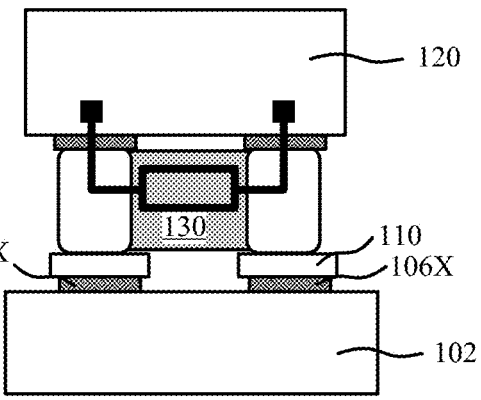
FIG. 3B is a schematic cross-sectional side view illustration of a die only path through a passive component in accordance with an embodiment.

FIG. 3B is a schematic cross-sectional side view illustration of a die only path through a passive component in accordance with an embodiment. For clarity, functionality of the passive component within the overlaid circuit path is illustrated as a generic box. In such a configuration, the passive component 130 is only electrically connected to a circuit within the die 120 and can be bonded to dummy landing pads 106X on the circuit board 102. For example, the dummy landing pads 106X may not be electrically connected to routing within the circuit board 102. In an embodiment, the passive component 130 is connected only to a die circuit only as a passive component, such as capacitor, inductor, resistor, etc.

Figure 3C:
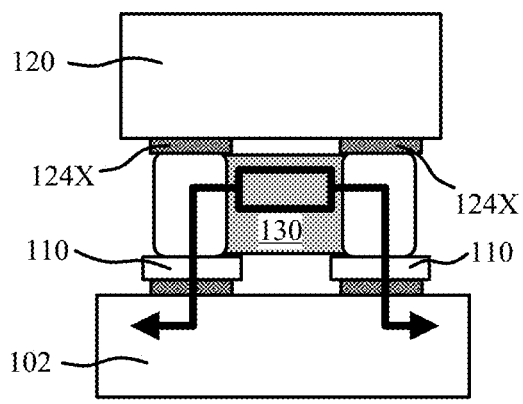
FIG. 3C is a schematic cross-sectional side view illustration of a circuit board only path through a passive component in accordance with an embodiment.

Similar to FIG. 3B, FIG. 3C is a schematic cross-sectional side view illustration of a circuit board only path through a passive component in accordance with an embodiment. In such a configuration, the passive component 130 is only connected to a circuit within the circuit board 102, and can be bonded to dummy contact pads 124X. For example, the dummy contact pads 124X may not be electrically connected to routing within the die 120 build-up structure 123. In an embodiment, the passive component 130 is connected a circuit board circuit only as a passive component, such as capacitor, inductor, resistor, etc.

Figure 3D:
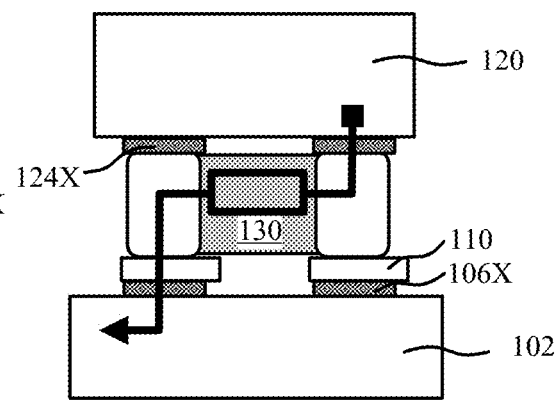
FIG. 3D is a schematic cross-sectional side view illustration of a series path through a passive component in accordance with an embodiment.

Referring now to FIG. 3D, a schematic cross-sectional side view illustration is provided of a series path through a passive component 130 in accordance with an embodiment. As shown, the series path may proceed through one of the terminals 132, 134 connected to the die 120, through the passive component 130, and to the other terminal 132, 134 connected to the circuit board 102. In the illustrated embodiment, terminal 132 electrically connected to the die 120 is bonded to contact pad 124 and dummy landing pad 106X, while terminal 134 electrically connected to the circuit board 102 is bonded to landing pad 106 and dummy contact pad 124X. In an embodiment, the passive component 130 is connected a circuit between the die 120 and circuit board 102 as passive component, such as capacitor, inductor, resistor, etc.

Figure 3E:
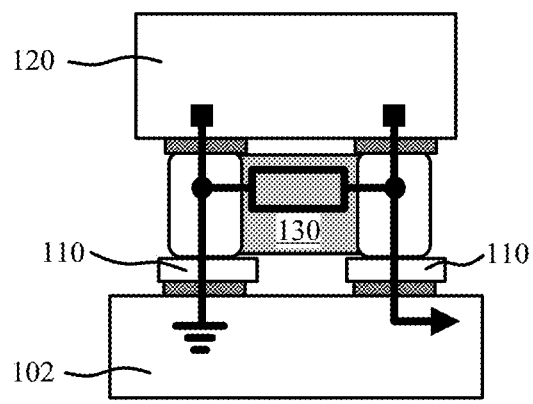
FIG. 3E is a schematic cross-sectional side view illustration of a multi-circuit path through a passive component in accordance with an embodiment.

FIG. 3E is a schematic cross-sectional side view illustration of a multi-circuit path through a passive component in accordance with an embodiment. As shown, the passive component 130 is connected to circuits in both the die 120 and circuit board 102. For example, the passive component may be coupled to both the die 120 and circuit board 102 as a passive component, such as capacitor, inductor, resistor, etc.

Figure 3F:
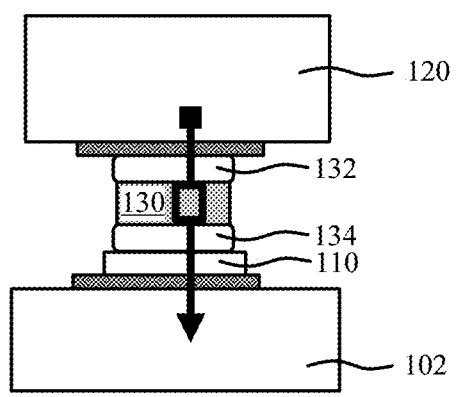
FIG. 3F is a schematic cross-sectional side view illustration of a series path through a passive component in accordance with an embodiment.

Up until this point, passive component 130 layouts have been described and illustrated in which the multiple terminals 132, 134, etc. are connected to both the die 120 and circuit board 102. However, embodiments are not so limited, and vertical passive components 130 can also be included in which the terminals 132, 134 are connected only to the die 120 or circuit board 102 as illustrated in FIG. 3F.

Figure 3G:
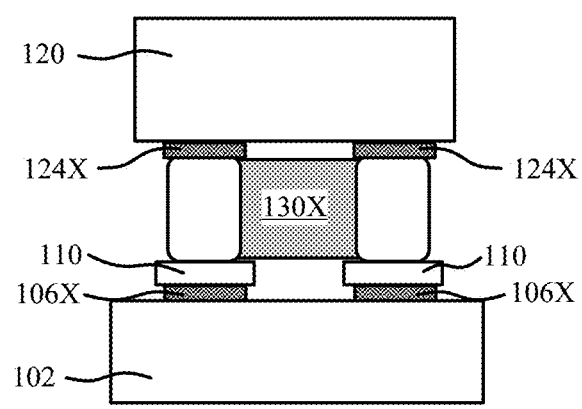
FIGS. 3G-3H are schematic cross-sectional side view illustrations of dummy connections without circuit paths in accordance with embodiments.
Figure 3H:
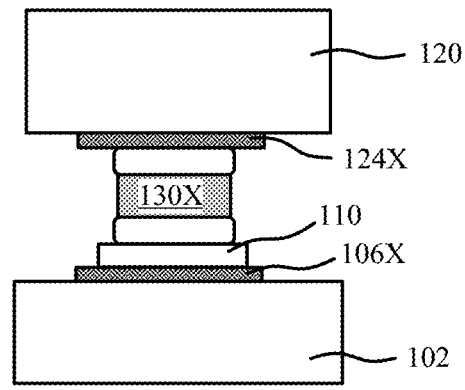

Furthermore, the dummy passive components 130X can also be included, where the terminals 132, 134 are bonded to only dummy landing pads 106X and dummy contact pads 124 as illustrated in FIGS. 3G-3H. Such dummy passive components 130X and connections may be useful for mechanical purposes and stress balancing of the package 100.

Figure 4:
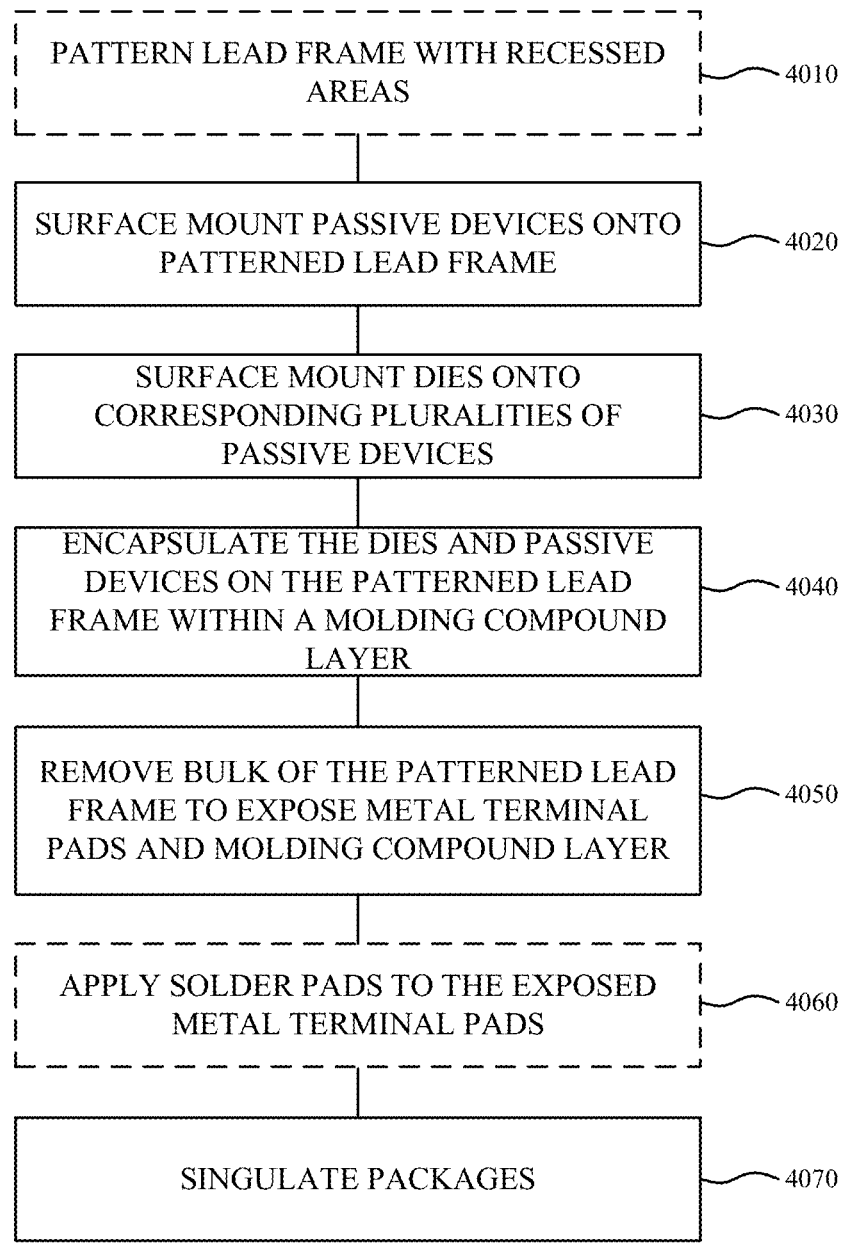
FIG. 4 is a process flow for a method of fabricating a package including a die bonded to top sides of a plurality of passive components in accordance with an embodiment.

Referring now to FIG. 4 and FIGS. 5A-5G, FIG. 4 is a process flow for a method of fabricating a package including a die bonded to top sides of a plurality of passive components in accordance with an embodiment; FIGS. 5A-5G are schematic cross-sectional side view illustrations for a sequence of fabricating packages including a die bonded to top sides of a plurality of passive components in accordance with an embodiment. In interest of clarity and conciseness, the description of the process flow of FIG. 4 is made with regard to the schematic cross-sectional side view illustrations of FIGS. 5A-5G.

Figure 5A:
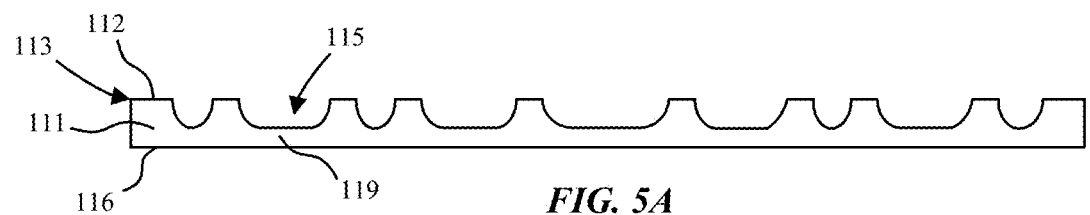
FIGS. 5A-5G are schematic cross-sectional side view illustrations for a sequence of fabricating packages including a die bonded to top sides of a plurality of passive components in accordance with an embodiment.

As shown in FIG. 5A, at operation 4010 a lead frame 111 is optionally patterned to include a plurality of cavities 115. For example, the lead frame 111 may be a metal frame including a top side 113 and bottom side 116, and cavities 115 can be patterned into the top side 113 using a suitable etching technique for example. The resulting top side 113 can include top sides 112 of terminal pads 110 to be formed. The cavities 115 may extend completely through or partially through the thickness of the lead frame 111. Where cavities 115 extend partially through the thickness of the lead frame a continuous metal layer 119 may extend underneath the cavities 115. Likewise, the bottom side 116 may be continuous. In this manner, the thickness of the continuous metal layer 119 may provide rigidity for subsequent processing including surface mounting and molding operations.

Figure 5B:
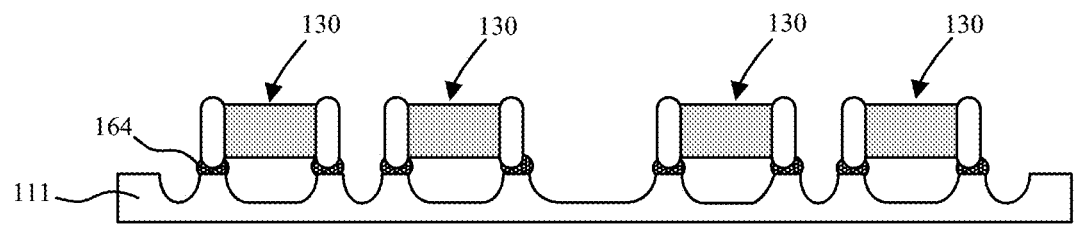
Figure 5C:
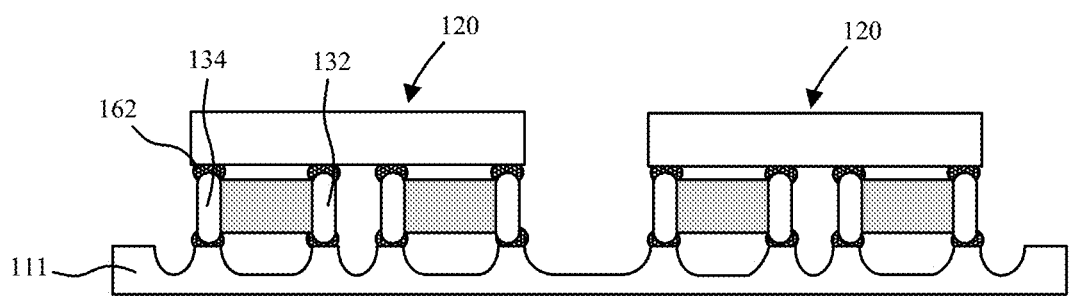

Referring now to FIG. 5B, at operation 4020 a plurality passive components 130 are mounted onto the patterned lead frame 111. For example, this may include stencil printing solder material 164 onto the top sides 113, 112 followed by pick and place of the plurality of passive components 130 and solder reflow at a first peak reflow temperature. A plurality of "known good" dies 120 may then be surface mounted onto corresponding pluralities of passive components 130 at operation 4030, as shown in FIG. 5C. For example, this may include stencil printing solder material onto the terminals 132, 134 of the passive components 130 and/or contact pads 124 of the dies 120, followed by pick and place of the dies 120 and solder reflow at a second peak reflow temperature. In an embodiment, the second peak reflow temperature may be less than the first peak reflow temperature. In this manner, the joints formed with solder material 164 are not reflowed again when mounting the dies onto the passive components 130.

Figure 5D:
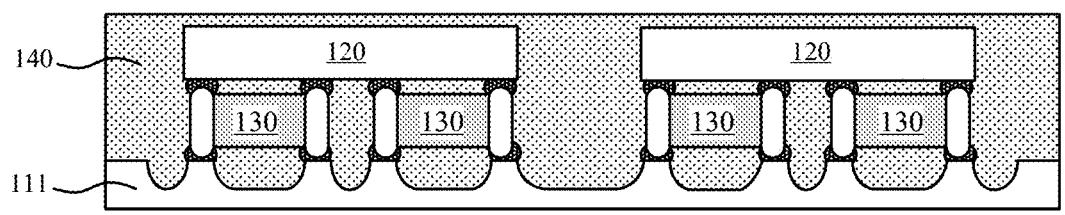

The surface mounting operations may then be followed by a molding operation 4040 where the dies 120 and passive components 130 mounted on the patterned lead frame 111 are encapsulated within a molding compound layer 140, as shown in FIG. 5D. In accordance with embodiments, the molding compound layer 140 can laterally surround the dies 120 and passive components 130, as well as flow into the cavities 115 and underneath the passive components 130.

Figure 5E:
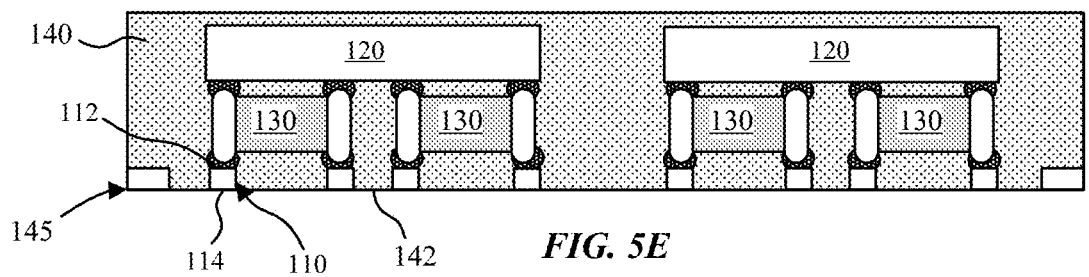
Figure 5F:
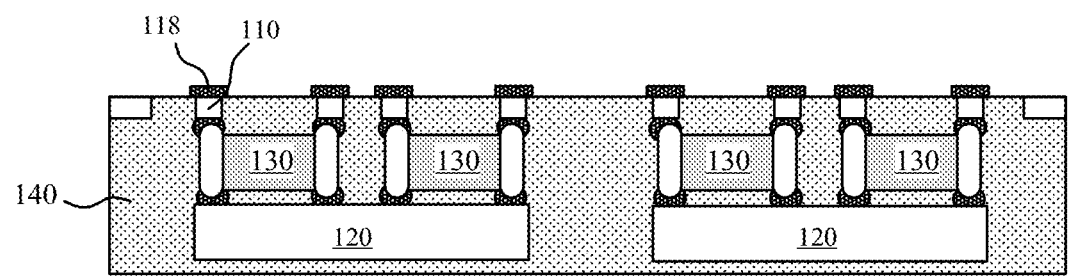
Figure 5G:
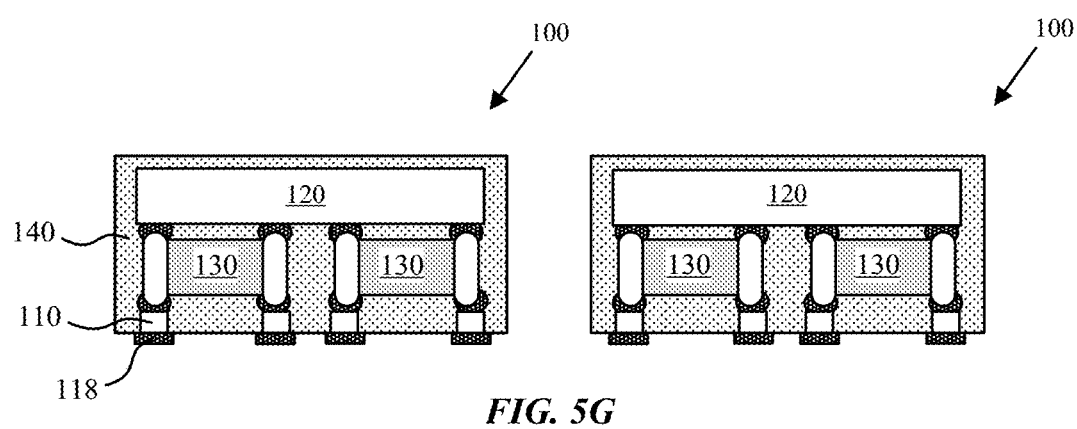

Referring now to FIG. 5E, at operation 4050 a bulk of the patterned lead frame 111 can then be removed to expose the metal terminal pads 110 and molding compound layer 140. For example, this may include a grinding and/or polishing operation resulting in a planarized surface 145 spanning a bottom side 142 of the molding compound layer 140 and the bottom sides 114 of the plurality of terminal pads 110. In the illustrated sequence, the continuous metal layer 119 may be removed, leaving pre-defined metal terminal pads 110. At this stage, it is possible to test operation and connectivity of the dies 120 and passive components 130 by probing the terminal pads 110. Following optional testing, solder paste can optionally be printed onto the exposed terminal pads 110 to form solder pads 118 as a surface finish, with optional reflow, at operation 4060 as shown in FIG. 5F, followed by package 100 singulation at operation 4070 as shown in FIG. 5G.

Referring now to FIGS. 6-10 various structural and process variations are illustrated. It is to be appreciated that while these are illustrated separately, that they are not necessarily restrictive of the embodiments illustrated and described with regard to FIGS. 1-5G, and many may be combined where suitable.

Figure 6:
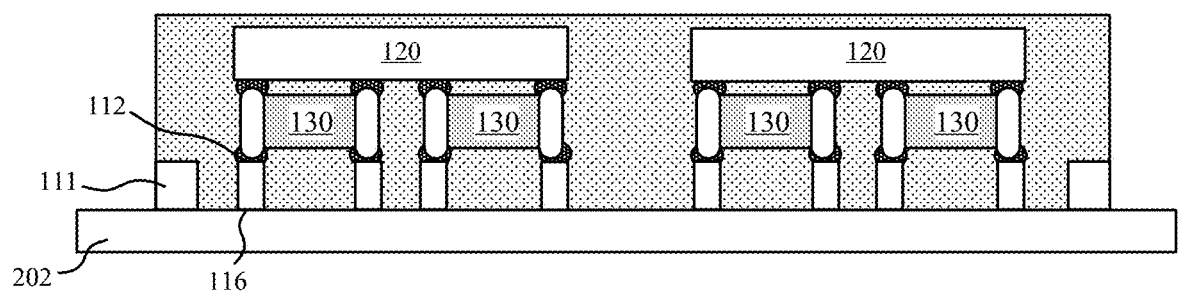
FIG. 6 is a schematic cross-sectional side view illustration including a lead frame with cavities formed completely through a thickness of the lead frame in accordance with an embodiment.

FIG. 6 is a schematic cross-sectional side view illustration including a lead frame 111 with cavities formed completely through a thickness of the lead frame in accordance with an embodiment. In particular, the embodiment illustrated in FIG. 6 may correspond to the structure after molding operation 4040, described with regard to FIG. 5D. In the variation illustrated in FIG. 6, the lead frame 111 is pre-patterned to include pre-defined metal terminal pads 110. As shown, the lead frame 111 can optionally be supported by a carrier substrate 202, which is removed after the molding operation. A thickness of the lead frame 111 and molding compound layer 140 can optionally be subsequently reduced, such as at operation 4050 previously described resulting in a substantially similar structure.

Figure 7:
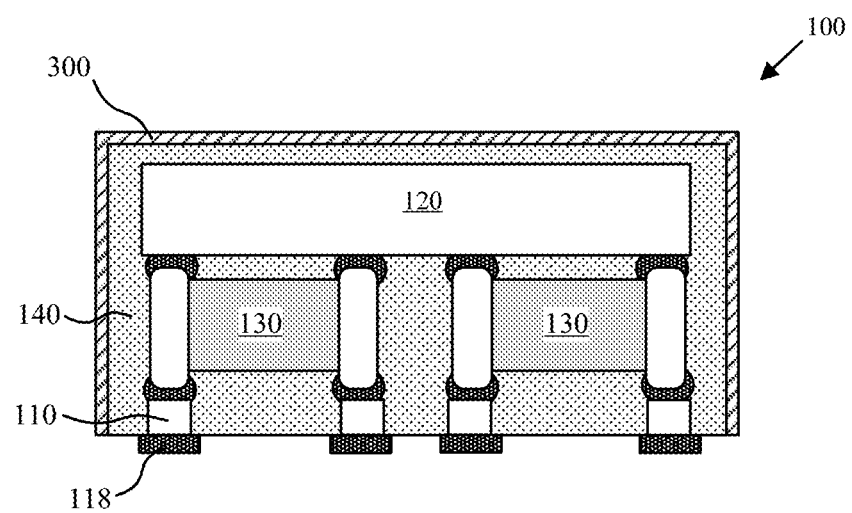
FIG. 7 is a schematic cross-sectional side view illustration of a package with EMI shield in accordance with an embodiment.

FIG. 7 is a schematic cross-sectional side view illustration of a package 100 with an electromagnetic interference (EMI) shield in accordance with an embodiment. For example, an electrically conductive shield layer 300 can be deposited on side surfaces and a top surface of the molding compound layer 140 using a suitable technique such as sputtering one or more conductive layers after package 100 singulation, such as copper, stainless steel, etc.

Figure 8:
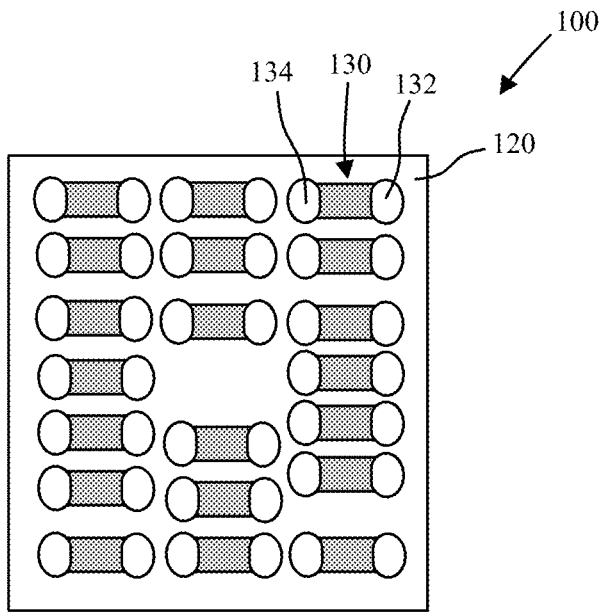
FIG. 8 is a schematic bottom view illustration of a plurality of passive components underneath a die in accordance with an embodiment.

Referring now to FIG. 8, a schematic bottom view illustration is provided for a plurality of passive components 130 underneath a die 120 in accordance with an embodiment. As shown, the plurality of passive components 130 can substantially populate the bottom side of the die 120 area, and hence package 100 area, with all electrical connections to the circuit board 102 being made through the terminals 132, 134 of the passive components 130. While not separately illustrated, dummy passive components 130X can also be distributed among the passive components 130.

Figure 9:
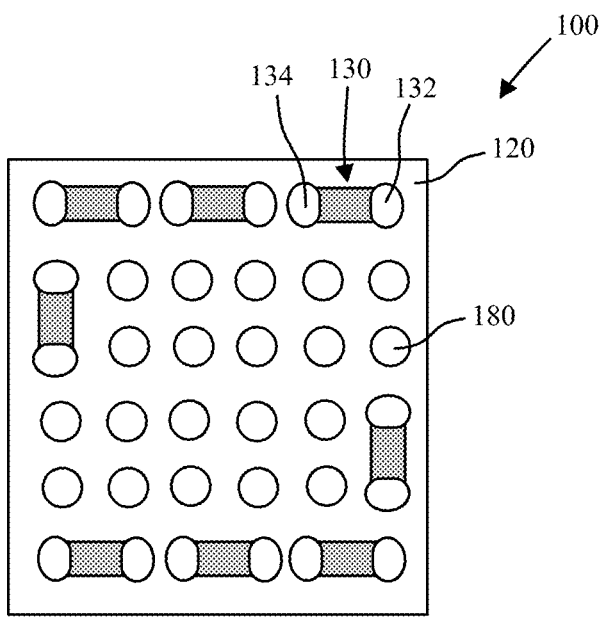
FIG. 9 is a schematic bottom view illustration of a plurality of passive components laterally adjacent a plurality of vertical interconnects underneath a die in accordance with an embodiment.
Figure 10:
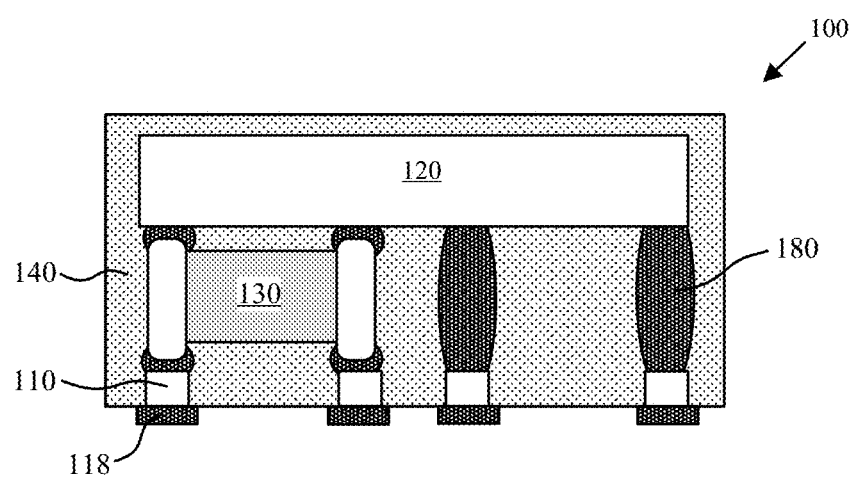
FIG. 10 is a schematic cross-sectional side view illustration of a passive component laterally adjacent a plurality of vertical interconnects underneath a die in accordance with an embodiment.

In some embodiments, additional vertical interconnects can be provided laterally adjacent to the plurality of passive components 130 to provide electrical connection between the circuit board 102 and die 120. FIG. 9 is a schematic bottom view illustration of a plurality of passive components 130 laterally adjacent a plurality of vertical interconnects 180 underneath a die 120 in accordance with an embodiment. For example, in the embodiment illustrated in FIG. 10 the vertical interconnects 180 can be a plurality of solder bumps (which can be cored, or not cored) are bonded to both the bottom side of the die 120 and a second plurality of landing pads 106 of the circuit board 102. In the embodiment illustrated the vertical interconnects 180 can be conductive pillars (e.g. copper plated). Such an arrangement may be used to provide a higher density of conductive pillars than density available with the passive component terminals 132, 134. Alternative vertical interconnects can also be used, such as printed circuit board (PCB) bars. For example, conductive pillars can be located within PCB bars.

Figure 11A:
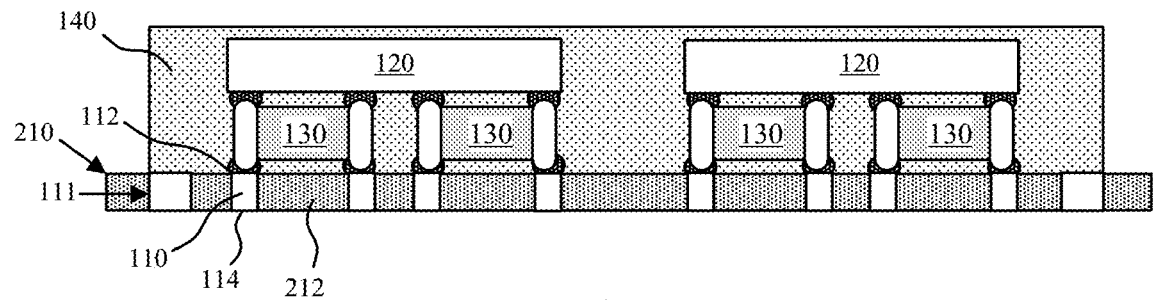
FIG. 11A is a schematic cross-sectional side view illustration including a package substrate with pre-packaged of terminal pads in accordance with an embodiment.
Figure 11B:
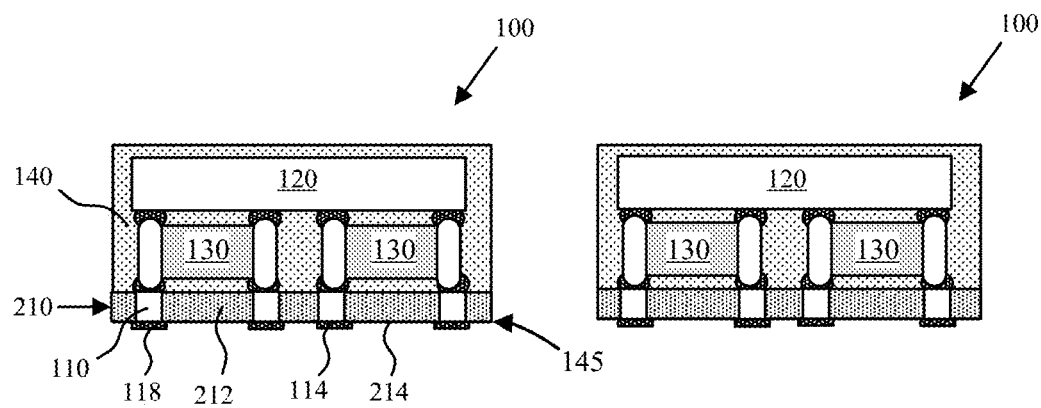
FIG. 11B is a schematic cross-sectional side view illustration of packages including the package substrate of FIG. 11A in accordance with an embodiment.
Figure 11C:
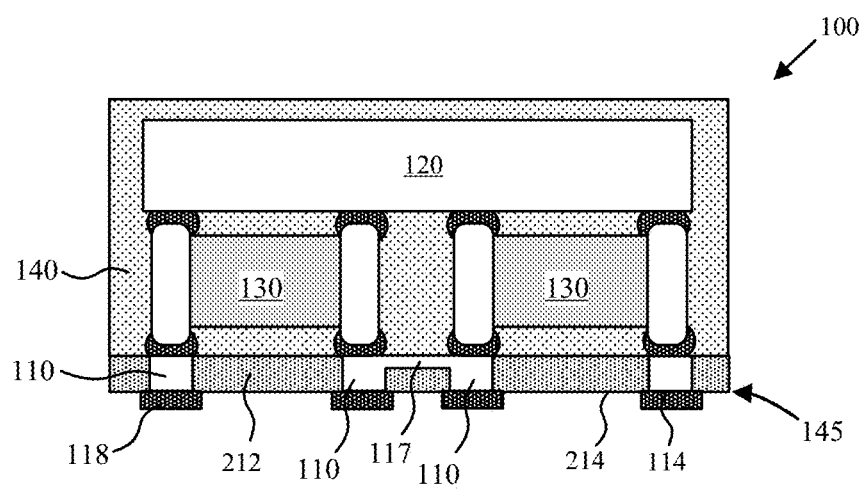
FIG. 11C is a schematic cross-sectional side view illustration of a package including a bridge between terminal pads in accordance with an embodiment.

Referring now to FIG. 11A, a schematic cross-sectional side view illustration is provided including a package substrate 210 with pre-packaged of terminal pads 110 in accordance with an embodiment. In such an embodiment, the terminal pads 110 (or lead frame 111) can be embedded within one or more insulation layers 212 of a package substrate 210. For example, in an embodiment the one or more insulation layers 212 is one or more molding compound layers, such as with a molded interconnect substrate (MIS) or it could be a pre-molded routable lead frame substrate or a regular multi-layer thin substrate with dielectric made of glass and copper interconnect. In this arrangement, the components 130 and dies 120 can be mounted and molded in a molding compound layer 140 as previously described, with a difference being the package substrate 210. Following the molding operation, the package substrate 210 may optionally be thinned as previously described at operation 4050, followed by the application of solder pads 118 and singulation of packages 100 as shown in FIG. 11B. In such a processing sequence, the bottom surface 145 of the package 100, prior to application of solder pads 118, can include bottom sides 114 of the terminal pads 110 and a bottom side 214 of the insulation layer(s) 212 (e.g. molding compound) of the package substrate 210. FIG. 11C is a schematic cross-sectional side view illustration of a package 100 including a bridge 117 between terminal pads 110 in accordance with an embodiment. Such a configuration may be fabricated using a MIS lead frame 111, routable lead frame and any multi-layer traditional substrate for example. In such a configuration the package substrate 210 insulation layer 212 may span underneath the bridge 117. While a bridge 117 is specifically illustrated, alternative lateral routing may be included for redistribution.

In utilizing the various aspects of the embodiments, it would become apparent to one skilled in the art that combinations or variations of the above embodiments are possible for forming a system in package with a die mounted onto a plurality of passive components. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. A package comprising:
   a plurality of terminal pads;
   a plurality of passive components bonded to top sides of the plurality of terminal pads with a first solder material;
   a die bonded to top sides of the plurality of passive components with a second solder material, wherein the first solder material is characterized by a higher reflow temperature than the second solder material; and
   a molding compound layer encapsulating the plurality of passive components and the die;
   wherein a planarized surface is comprised of and spans bottom sides of the plurality of terminal pads and a bottom side of the molding compound layer.
2. The package of claim 1, wherein a portion of the molding compound layer spans underneath the plurality of passive components and laterally between the plurality of terminal pads.
3. The package of claim 1, wherein the terminal pads are copper studs and include planarized top sides.
4. The package of claim 3, wherein the copper studs are each less than 75 μm tall.
5. The package of claim 1, further comprising an electrically conductive shield layer spanning side surfaces and a top surface of the molding compound layer.
6. The package of claim 1, further comprising a vertical interconnect laterally adjacent the plurality of passive components, and connecting a terminal pad of the plurality of terminal pads to the die.
7. The package of claim 1, further comprising a plurality of solder pads on the bottom sides of the plurality of terminal pads.
8. The package of claim 1, wherein a total thickness between the planarized surface and a top surface of the molding compound layer is less than 650 μm.
9. A module comprising:
   a circuit board including a top side including a plurality of landing pads; and
   a package mounted on the circuit board and bonded to the plurality of landing pads, the package including:
   a plurality of terminal pads;
   a plurality of passive components bonded to top sides of the plurality of terminal pads with a first solder material;
   a die bonded to top sides of the plurality of passive components with a second solder material, wherein the first solder material is characterized by a higher reflow temperature than the second solder material; and
   a molding compound layer encapsulating the plurality of terminal pads, the plurality of passive components and the die;
   wherein a planarized surface is comprised of and spans bottom sides of the plurality of terminal pads and a bottom side of the molding compound layer.
10. The module of claim 9, wherein the package is bonded to the plurality of landing pads with a plurality of solder joints.
11. The module of claim 9, wherein the terminal pads are copper studs including planarized top sides.
12. A method comprising:
   surface mounting a plurality of passive components onto a patterned lead frame with a first solder material;
   surface mounting a die onto the plurality of passive components with a second solder material to bond the die to the top sides of the plurality of passive components, wherein the first solder material is characterized by a higher reflow temperature than the second solder material;
   encapsulating the die and the plurality of passive components on the patterned lead frame within a molding compound layer; and
   removing a bulk of the patterned lead frame to expose metal terminal pads and the molding compound layer and create a planarized surface that spans bottom sides of the plurality of terminal pads and a bottom side of the molding compound layer, wherein the plurality of passive components is bonded to top sides of the plurality of terminal pads with the first solder material and the molding compound layer encapsulates the plurality of terminal pads.
13. The method of claim 12, wherein removing the bulk of the patterned lead frame comprises removing a continuous metal layer.

14. The method of claim 12, wherein removing the bulk of the patterned lead frame comprises reducing a thickness of pre-defined metal terminal pads.

15. The method of claim 12, further comprising:
- reflowing the first solder material at a first peak reflow temperature; and
- reflowing the second solder material at a second peak reflow temperature, wherein the first peak reflow temperature is higher than the second peak reflow temperature.

* * * * *